July 31, 1973 H. D. TITTLE 3,749,601

ENCAPSULATED PACKAGED ELECTRONIC ASSEMBLY

Filed April 1, 1971

Harry D. Tittle,
INVENTOR.
BY Alton O. Oberholtzer
ATTORNEY.

United States Patent Office 3,749,601

Patented July 31, 1973

3,749,601

ENCAPSULATED PACKAGED ELECTRONIC ASSEMBLY

Harry D. Tittle, Cypress, Calif., assignor to Hughes Aircraft Company, Culver City, Calif.

Filed Apr. 1, 1971, Ser. No. 130,125
Int. Cl. H01l *1/10*
U.S. Cl. 117—218 5 Claims

ABSTRACT OF THE DISCLOSURE

An improvement in the economy of packaging by locking out harmful particulates before application of insulation packing and savings in rework or repair of insulation packaged and encapsulated electrical components, assemblies or circuitry. The three component package structure provided is prefabricated electronic circuitry components structure having a conformal coating of relatively solvent insoluble polymers as polymers of para-xylylene material or relatively solvent insoluble polymers of polyphenylene and curing agent intermediate the electronic components and a conventionally applied relatively solvent soluble coating of insulating resin material or conventional foam as polyurethane, epoxy resin, and the like potting material applied thereover. In addition to improving upon the insulation encapsulated prefabricated electronic circuitry by reducing the number of defective electronic units manufactured, this improved packaging also is of economic value to the industry by enabling economic chemical removal of the insulating foam or potting compound and reworking the circuitry or replacement of a defective circuitry component.

Further, the multiple coatings provide more assurance of maintaining resonate frequency and aids in improving vibration and shock resistance.

BACKGROUND OF THE INVENTION

Field of the invention

The method of plural encasement and packaging prefabricated electronic circuitry components and completed electronic units on a substrate upon which the electronic circuitry is prefabricated, including the products thereof. More particularly, the method of encasing electronic units in a conformal coating of relatively chemically insoluble polymerized para-xylylene or polyphenylene film and a relatively chemically soluble conformal coating of conventional potting compound or insulating plastic material providing a lock-out of material detrimental to the electronic circuitry and permitting solvent removal of the conventional potting or insulating material to facilitate repair and parts replacement, and the packaged products thereof providing multiple conformed coatings of relatively solvent soluble polymers and relatively insoluble solvent polymers.

Description of the prior art

Conventional electronic circuitry in the form of electronic modules comprised of one or more substrates upon or between which is constructed an integrated circuitry of component elements as capacitors, resistances, tubes, coils, gates or other electronic elements are conventionally enclosed in a potting compound of insulating material such as epoxy or polyurethane foam. A conventional manner of packaging electronic assemblies of integrated circuitry components with entrapment of harmful particulates and defective parts in manufacture, is exemplified by a recent article in "Modern Plastics," June 1970, entitled "Encapsulating Semiconductor Device by Transfer Molding Epoxies," pages 116–120. Similar packaging is effected using conventional polyurethane solids or foam. Faulty circuitry or defective assemblies occurring in manufacture has necessitated discarding or repair on the order of 20 to 30 percent of the solid or foam packaged assemblies. The cost of repair, reworking or replacement of a defective part in a foam packaged module of electronic assembly has been on the order of $42.00 per unit. This is caused by the several hours of reworking time required in digging out the solid or foam potting compound. In most cases these modules result in a "throwaway" package due to the inability to rework mechanically. Average cost is about $75.00. Any known deencapsulating solvent therefor is detrimental to the component elements or substrate of the electronic assembly. Otherwise, in the packaging of MOS circuitry comprised of (metal-oxide semiconductors) and integrated circuitry elements, as drain or collector, gate, emitter and integrated circuitry, when packaged in a potting compound is oftentimes damaged by entrapped particulate materials which are oftentimes in the potting compound.

SUMMARY OF THE INVENTION

An improvement in the economics of packaging integrated circuitry as modules and MOS packages and facilitating rework and repair of organically potted or foam packaged electrical assembled units generally referred to as encapsulated electronic modules, or potted, as foam encapsulated electronic circuitry, as indicated and of the character of dual-in-line integrated circuits, can-type components, transistors and relays, leg supported hybrid circuits, variable resistors and potentiometers, female connectors, floating pin connectors and spacers, and the like. The improvement now provides for clean packaging of integrated circuitry by applying a relatively insoluble chemical resistant conformal coating of an organic polymer system, preferably of poly(p-xylylene) polymers, or less preferably, other insoluble polymers of polymerizable p-xylylene, or phenylene and xylylene copolymers which may be applied in solution form and heat-set. Over such relatively insoluble conformed coating is applied a second conventional conformal coating of relatively chemically soluble potting or foam encapsulating composition. The first conformal polymer coating is a relatively chemically insoluble resistant barrier film which locks out detrimental dust particles and particularly dust and electronically damaging particulates invariably entrapped in a conventionally applied relatively solvent soluble potting or foam encapsulating composition. This barrier film now permits chemical deencapsulation of the potted or foamed electronic assembly which has been a major problem in the art and a drawback to packaging with a potting or foam encapsulating insulation. When the potting or foam coating is removed, the covering polymer coating is cut through and the defective circuitry reworked or defective component replaced. After reworking or replacement, the relatively insoluble polymer coating and the relatively soluble potting or foam insulation coating is reapplied.

DESCRIPTION OF THE PREFERRED EMBODIMENT

Figure 1:
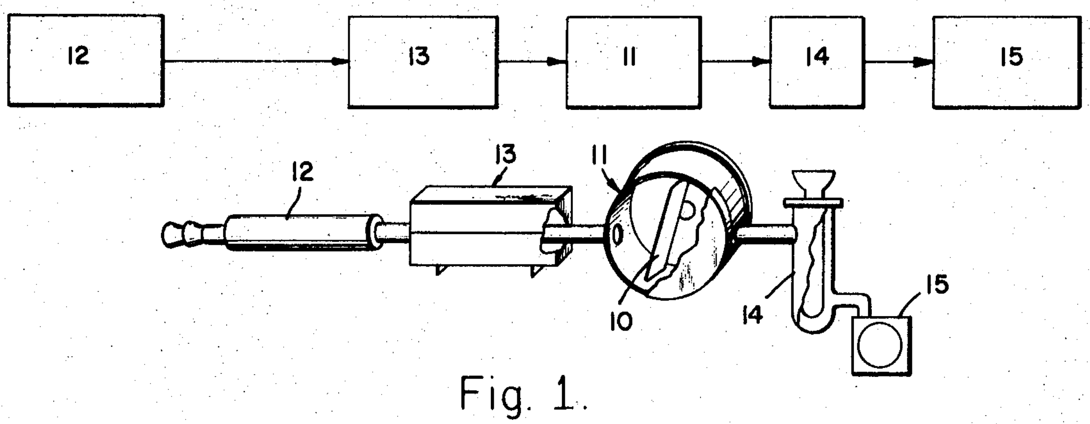
FIG. 1 is a diagrammatic illustration of a system of application of an initial conformal coating of parylene polymers over which is applied a second conformal insulation coating of conventional foam encapsulation.

Referring to FIG. 1, a prefabricated electronic module 10 is thoroughly cleaned by, for example, treating with a vapor degreasing compound as Freon, the leads are masked with suitable masking tape as Teflon or the like and the module is placed or positioned by suitable mountings (not shown) in a polymer deposition chamber 11 of a closed coating system, as herein described. Placed in the vaporizer 12 is a solids dichloro-di-para xylylene and heated to a temperature of about 250° C. under pressure of about 1 torr. The vaporized dimer, dichloro-di-para xylylene, is passed into a pyrolysis chamber 13 heated to about 680° C. and under pressure of about 0.5 torr. The monomeric pyrolyzed vapor is passed into the room temperature about 25° C. to about 70° C., deposition chamber 11 where it simultaneously adsorbs and polymerizes as a conformal coating on the module 10 and all substrate surfaces. The coating system is provided with a cold thimble trap 14 maintained at about .01 to .001 torr by a mechanical vacuum pump 15. The vaporizer, pyrolysis, deposition chamber, trap and pump is a mechanical arrangement of conventional structure enabling the application of the conformal p-xylylene polymer coating as by the above steps illustrated as follows:

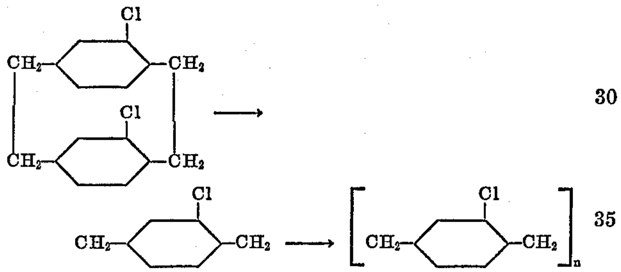

After the conformal coating of p-xylylene polymers is formed, the module 10 is removed from the deposition chamber, the masking tape removed and the conformally coated module 10 is next encased in a conventional conformal potting or foam insulation in a conventional mold therefor. For example, a conventional polyurethane or epoxy foam is applied as described in the above publication.

The polyurethane, for example, is a typical reactive product, an isocyanate and an alcohol, ether or glycol, resulting in the formation of a urethane of the type known to be chemically depottable, as hereinafter illustrated. The art is familiar with polyurethanes of the generalized form

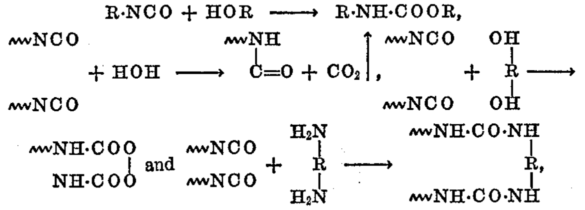

and the application or use therewith of a conventional gaseous foaming agent and catalyst effecting cure.

Typical of the relatively soluble epoxy structures having terminal oxirane groups is the following:

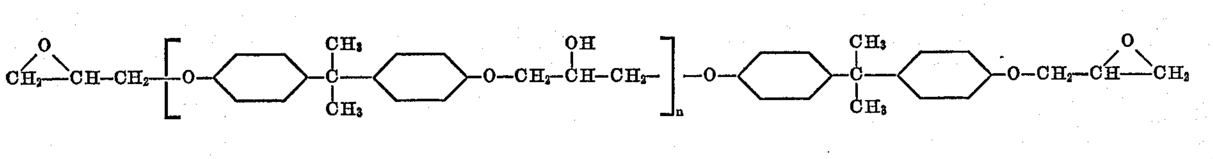

Many substitutions are possible in this structure, however, accounting for many different end products.

Otherwise, epoxy compounds having an internal oxirane group

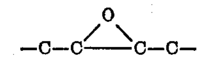

or groups, can be utilized with conventional curing and "blowing" agent materials or commercially known foam-polyethylene and the like, utilizable as insulation materials for electronic circuitry may be applied as the potting compound forming a conformal relatively soluble coating enclosing the relatively insoluble conformal coating.

For some electronic components as a coil, resistor, diode, semiconductor, and the like, or circuitry capable of withstanding about up to 150° C. and higher cure temperature, a mixture of polyphenylene material and polysulfonyl halide or polymethylol and acid catalyst curing agent mixture, curable to a relatively chemical insoluble film, can be applied by brush, dip or spray coating and heat cured.

Thereafter, by conventional packaging procedure and equipment, a conventional epoxy or polyurethane foam composition is automatically mixed and injected into the mold assembly, and about the circuitry structure, with a conventional dispenser. The foamed (encapsulated) module is then cured at 200° F.±10° F. for about 2 hours. After cure, the packaged modules are taken from the mold assembly, cleaned and tested for operability. If the modules are found defective, the previous necessity of digging away the potting or foam insulation is eliminated and the defective modules are now immersed into a solution in which the inner conformal coating is insoluble and the outer conformal coating is soluble. Such solution can be either one of the following formulas:

(a)

70% methyl or ethyl Cellosolve by weight
28% N-methyl pyrrolidone by weight
2% potassium hydroxide by weight (b)

⅓ DMSO by volume
⅓ butyl Cellosolve by volume
⅓ butyl Carbitol by volume

Both of these formulations have been found effective at temperatures of 150° F.–160° F. when the packaged module is immersed therein and the conformal external potting or foam is broken down and removable after about one-half hour treatment. After removal from the de-encapsulating solution, the modules are thoroughly washed and rinsed in deionized water. For repair, the internal conformal coating is cut and the repairs made. Thereafter the module is again repackaged in the conformal chemical resistant insulation coating and conformal potting or foam coating.

Figure 2:
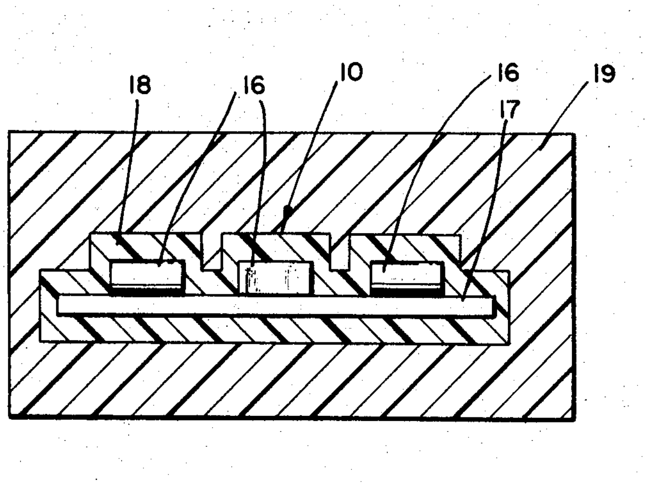
FIG. 2 is an illustrated cross-sectional view of an electronic module encapsulated in a conformal chemical resistant film insulation, shown in exaggerated form, and a chemically soluble conformal packaging coating of potting compound.

For example, as illustrated in FIG. 2, there is provided a packaged electronic circuitry of electrical components 16 on insulation substrate 17 first encased in a relatively chemical insoluble conformal coating 18 as described, and a second relatively chemical soluble conformal packaging 19 of conventional potting or foam composition.

As heretofore indicated, the initial conformal relatively solvent insoluble coating for high temperature resistant component elements and circuitry may be provided by spray, dip or other coating application of a solution of chlorinated solvent soluble polyphenylene polymers of biphenyl, terphenyl, quaterphenyl and the like material in combination with a polymethylol and acid catalyst, or polyfunctional curing agent, as polysulfonyl halides, and the like which are curable to relatively insoluble coating films at temperatures of normally above 100° C. and on the order of 150° C. and above. In the application of such coating material care must be taken in selection of electronic component structure which will withstand the cure temperature which is required to effect completion of cure reaction without retention of free salt or component constituents, which may be detrimental to the electronic component or circuitry. With such film material, it is preferable to effect a postcuring of several hours at programmed temperatures ranging from about 130° C. to about 280° C. to eliminate the retention of free radicals which may be detrimental, before application of the potting composition.

The present invention, discoveries or improvements now provide for less costly time in network and surprisingly reduces the number of completed assemblies requiring reworking by locking out materials detrimental to the electronic circuitry.

Having thus described and illustrated the new advantages provided, it will now be recognized that some modifications and variations in the constituents may be made without departing from the spirit and scope of my disclosure. The specific example is provided by way of illustration of my discoveries, invention or improvement as defined in the following claims.

What is claimed is:

1. A packaged electronic assembly of circuitry elements mounted on a substrate and the whole of which is encased in a conformal intermediate coating of relatively solvent resistant and insoluble organic polymers and an external conformal insulation coating of relatively solvent soluble potting compound, wherein said organic polymers are polymers of para-xylylene or polyphenylene and said potting compound is polyurethane or epoxy.

2. The structure of claim 1 wherein the said intermediate coating is a para-xylylene polymer.

3. The structure of claim 2 wherein the potting compound is an epoxy resin foam.

4. The structure of claim 1 wherein said intermediate coating is a copolymer of polyphenylene and a curing agent.

5. The structure of claim 1 wherein said potting compound is polyurethane.

References Cited

UNITED STATES PATENTS

| | | | |
|---|---|---|---|
| 3,191,005 | 6/1965 | Cox | 117—218 X |
| 2,725,312 | 11/1955 | Schell | 117—218 |
| 2,964,831 | 12/1960 | Peterson | 29—588 X |
| 3,030,562 | 4/1962 | Maiden et al. | 29—588 |
| 3,606,673 | 9/1971 | Overman | 29—588 |
| 3,397,085 | 8/1968 | Cariou et al. | 117—218 X |
| 3,455,736 | 7/1969 | Davis et al. | 117—218 |
| 3,243,414 | 3/1966 | De Witt et al. | 264—272 X |
| 3,388,464 | 6/1968 | Pretty | 117—218 X |
| 2,888,736 | 6/1959 | Sardella | 29—588 |
| 3,566,458 | 3/1971 | O'Cone | 29—588 |

RALPH HUSACK, Primary Examiner

U.S. Cl. X.R.

29—575, 588; 117—2, 106 R; 264—272